(12) United States Patent
Lu

(10) Patent No.: US 10,957,406 B2
(45) Date of Patent: Mar. 23, 2021

(54) MEMORY SYSTEM THAT DETERMINES A TYPE OF STRESS OF A MEMORY DEVICE

(71) Applicant: Toshiba Memory Corporation, Tokyo (JP)

(72) Inventor: Yichao Lu, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/283,615

(22) Filed: Feb. 22, 2019

(65) Prior Publication Data

US 2020/0098438 A1 Mar. 26, 2020

(30) Foreign Application Priority Data

Sep. 20, 2018 (JP) .............................. JP2018-175989

(51) Int. Cl.
| | |
|---|---|
| *G11C 16/34* | (2006.01) |
| *G06F 11/10* | (2006.01) |
| *G11C 29/52* | (2006.01) |
| *G11C 29/42* | (2006.01) |
| *G11C 29/44* | (2006.01) |
| *G11C 16/26* | (2006.01) |
| *G11C 11/56* | (2006.01) |
| *G11C 16/04* | (2006.01) |
| *G06F 12/02* | (2006.01) |

(52) U.S. Cl.
CPC ...... *G11C 16/3418* (2013.01); *G06F 11/1048* (2013.01); *G06F 11/1068* (2013.01); *G06F 12/0246* (2013.01); *G11C 11/5642* (2013.01); *G11C 16/0483* (2013.01); *G11C 16/26* (2013.01); *G11C 16/3495* (2013.01); *G11C 29/42* (2013.01); *G11C 29/44* (2013.01); *G11C 29/52* (2013.01); *G06F 2212/7203* (2013.01); *G11C 2211/5641* (2013.01)

(58) Field of Classification Search
CPC .. G11C 16/0483; G11C 16/34; G11C 16/3418
USPC .......................... 365/185.17, 185.09, 185.02
See application file for complete search history.

(56) References Cited

U.S. PATENT DOCUMENTS

| | | | |
|---|---|---|---|
| 7,252,839 B2 | 8/2007 | Hallinen et al. | |
| 7,768,830 B2 | 8/2010 | Shibata et al. | |
| 8,000,141 B1 * | 8/2011 | Shalvi ................. | G11C 11/5628 |
| | | | 365/185.09 |
| 8,929,140 B2 | 1/2015 | Nagashima | |
| 10,020,063 B2 | 7/2018 | Nagashima | |
| 2010/0091535 A1 * | 4/2010 | Sommer .................. | G11C 8/20 |
| | | | 365/45 |
| 2013/0343131 A1 | 12/2013 | Wu et al. | |

(Continued)

FOREIGN PATENT DOCUMENTS

| | | |
|---|---|---|
| JP | 5349256 B2 | 11/2013 |
| JP | 5355667 B2 | 11/2013 |

*Primary Examiner* — Alfredo Bermudez Lozada
(74) *Attorney, Agent, or Firm* — Foley & Lardner LLP

(57) ABSTRACT

According to some embodiments, a memory system includes a memory device including a plurality of memory cells capable of storing a plurality of bit data corresponding to a plurality of levels, respectively, and a controller configured to read data from the memory device, perform an error correction when there is an error in the read data, and determine a variation in a level before and after error correction of the read data.

12 Claims, 10 Drawing Sheets

(56) References Cited

U.S. PATENT DOCUMENTS

2014/0101519 A1\* 4/2014 Lee .................... G06F 11/1068
  714/773
2015/0154065 A1\* 6/2015 Ghaly ................ G06F 11/0793
  714/6.12

\* cited by examiner

FIG. 5

| | Er | A | B | C | D | E | F | G |
|---|---|---|---|---|---|---|---|---|
| upper | 1 | 1 | 1 | 0 | 0 | 0 | 0 | 1 |
| middle | 1 | 1 | 0 | 0 | 1 | 1 | 0 | 0 |
| lower | 1 | 0 | 0 | 0 | 0 | 1 | 1 | 1 |

FIG. 10
FIG. 11
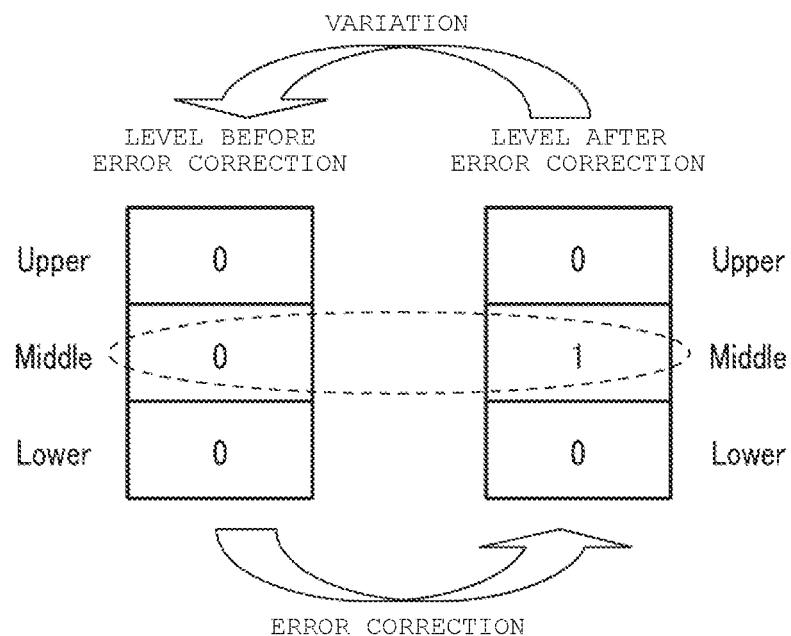
FIG. 12
|       | Er | A | B | C | D | E | F | G  |
|-------|----|---|---|---|---|---|---|----|
| Left  |    | 0 | 1 | 1 | 2 | 2 | 2 | 5  |
| Right | 13 | 5 | 7 | 5 | 5 | 4 | 16 |    |

MEMORY SYSTEM THAT DETERMINES A TYPE OF STRESS OF A MEMORY DEVICE

CROSS-REFERENCE TO RELATED APPLICATION

This application claims the benefit and priority to Japanese Patent Application No. 2018-175989, filed Sep. 20, 2018, entire contents of which are incorporated herein by reference.

FIELD

Embodiments described herein relate generally to a memory system.

BACKGROUND

A NAND type flash memory is known as a semiconductor storage device.

DESCRIPTION OF THE DRAWINGS

FIG. 5 is a diagram showing a relationship between a threshold voltage of a memory cell transistor and data according to some embodiments.

FIG. 10 is a diagram showing a part of a detailed example of determining the type of stress.

FIG. 11 is a diagram showing a part of a detailed example of determining the type of stress.

FIG. 12 is a diagram showing a part of a detailed example of determining the type of stress.

DETAILED DESCRIPTION

Figure 1:
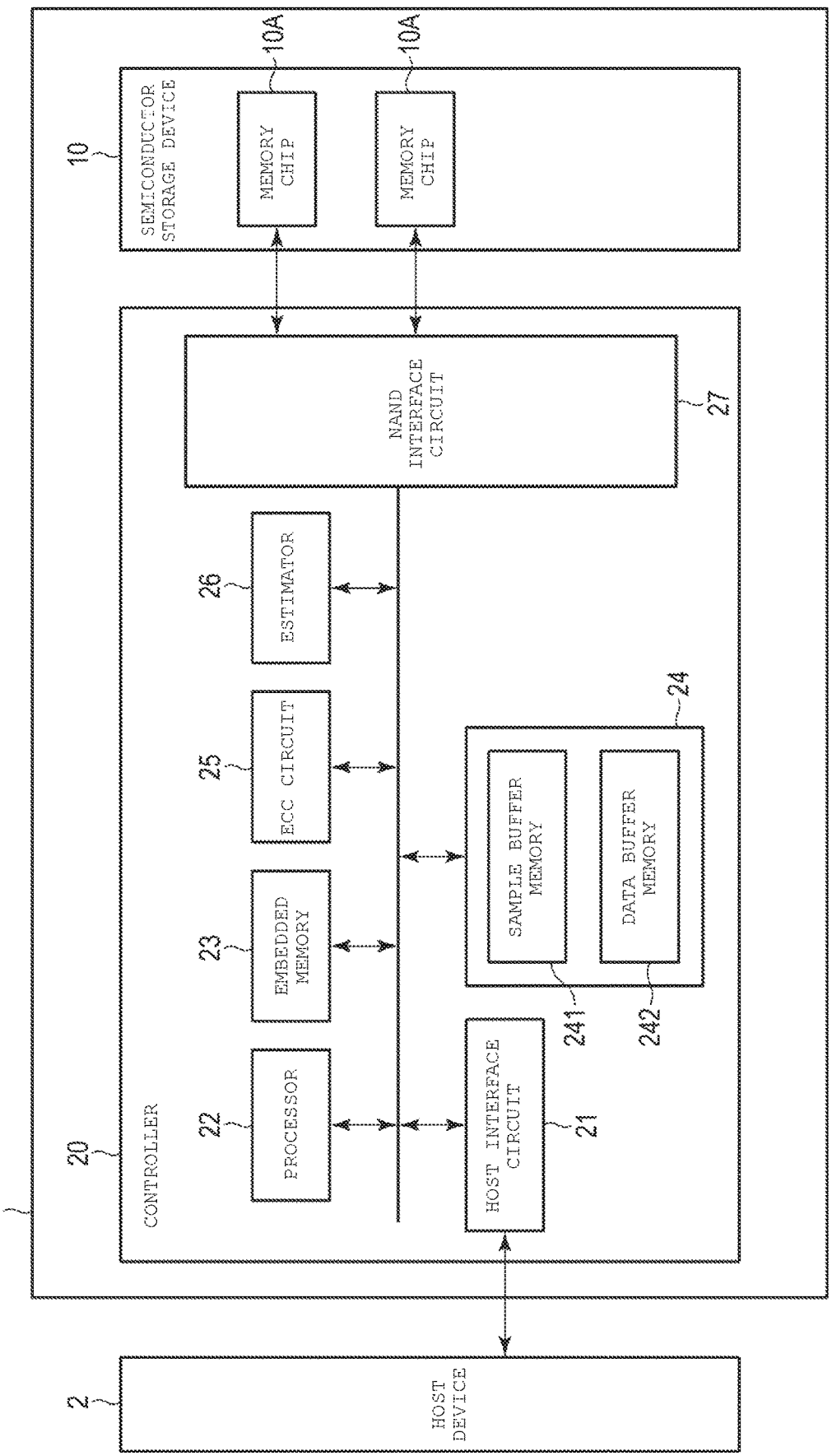
FIG. 1 is a diagram showing a memory system according to some embodiments.

Embodiments provide a high quality memory system.

In general, according to some embodiments, a memory system may include a memory device that has a plurality of memory cells capable of storing a plurality of bit data corresponding to a plurality of levels, respectively, and a controller that reads data from the memory device, performs error correction when there is an error in the read data, and determines a variation in the level before and after error correction of the read data.

Hereinafter, the details of the embodiment will be described with reference to the drawings. In the description, the like elements will be denoted by the same reference numerals throughout the drawings.

<1> Embodiments

<1-1> Configuration

First, a configuration of a memory system according to some embodiments will be described.

<1-1-1> Overall Configuration of Memory System

An example configuration of a memory system according to some embodiments will be described with reference to FIG. 1. FIG. 1 is a block diagram showing an example of a configuration of a memory system according to some embodiments. The memory system 1 is connected to a host device 2 through a communication line and serves as an external storage device of the host device 2. The host device 2 may be, for example, an information processing device such as a personal computer, a mobile phone, an imaging device, a portable terminal such as a tablet computer, a smartphone, or the like, a game device, and an in-vehicle terminal such as a car navigation system, or the like.

The memory system 1 may hold data from the host device 2 and read the data to the host device 2.

As shown in FIG. 1, the memory system 1 includes a controller 20 and a semiconductor storage device (or memory device) 10. The controller 20 may receive a command from the host device 2 and control the semiconductor storage device 10 based on the received command. Specifically, the controller 20 may write data instructed to be written by the host device 2 to the semiconductor storage device 10, and read the data instructed to be read by the host device 2 from the semiconductor storage device 10 and transmit the data to the host device 2. The controller 20 may be connected to the semiconductor storage device 10 through a NAND bus. The semiconductor storage device 10 includes a plurality of memory cells and stores data in a non-volatile manner. The semiconductor storage device 10 may be a device that stores data in a non-volatile manner. For example, the semiconductor storage device is a non-volatile semiconductor memory including a plurality of memory chips 10A (see FIG. 2). Each of the memory chips may operate independently of each other, such as, for example, a NAND type flash memory chip. In a NAND type flash memory, writing and reading may be performed in units of data called 'pages', and erasing may be performed in units of data called 'blocks'.

The memory system 1 may be a memory card in which the controller 20 and the semiconductor storage device 10 are configured as one package, or may be a solid state drive (SSD).

<1-1-2> Configuration of Controller

Continuing with FIG. 1, the controller of the memory system according to some embodiments will be explained. The controller 20 includes a host interface circuit 21, a processor (e.g., Central Processing Unit (CPU)) 22, an embedded memory (e.g., Random Access Memory (RAM)) 23, a buffer memory 24, an error check and correction (ECC) circuit 25, an estimator 26, and a NAND interface circuit 27.

The host interface circuit 21 is connected to the host device 2 for communication with the host device 2. For example, the host interface circuit 21 may transmit commands and data received from the host device 2 to the processor 22 and the buffer memory 24, respectively.

The processor 22 may control the overall operation of the controller 20. The processor 22 may issue a read command based on the NAND interface circuit 27 to the semiconductor storage device 10, in response to a data read command received from the host device 2, for example. This operation is similar to the case of writing and erasing. In addition, the processor 22 may serve to execute various calculations on the read data from the semiconductor storage device 10. When power is applied to the memory system 1, the processor 22 may control the overall operation of the controller 20, by reading a firmware (e.g., control program) stored in a ROM (not shown) onto a buffer memory 24 or a RAM (not shown) in the controller 20 to execute predetermined processing. Here, the processor 22 may be also referred to as a core or a processor core. The control of the overall operation of the controller 20 may be implemented by a predetermined hardware rather than by the processor 22 executing the firmware.

For example, the embedded memory 23 may be a semiconductor memory such as a Dynamic RAM (DRAM) and may be used as a work are of the processor 22. The embedded memory 23 may hold firmware, various management tables, and the like for managing the semiconductor storage device 10.

The buffer memory 24 may temporarily hold data and the like received by the controller 20 from the semiconductor storage device 10 and the host device 2. More specifically, the buffer memory 24 includes a sample buffer memory 241 and a data buffer memory 242. For example, the sample buffer memory 241 may temporarily store read data (e.g., data before error correction) from the semiconductor storage device 10. The data buffer memory 242 may temporarily hold calculation results and the like for the read data. For example the buffer memory 24 may include a general-purpose memory such as static RAM (SRAM) or DRAM. Further, the buffer memory 24 may be embedded in the controller 20, or may be provided outside the controller 20 independently of the controller 20.

The FCC circuit 25 may perform error detection and error correction process. More specifically, at the time of writing data, an ECC code may be generated for each set of a certain number of data based on the data received from the host device 2. In addition, when data is read, is the data may be decoded based on the ECC code to detect the presence or absence of an error. When an error is detected, the bit error location may be specified and the error may be corrected.

The estimator 26 may estimate the type of data variation based on the data read from the semiconductor storage device 10. Specifically, the estimator 26 may estimate the stress type by the transition of the threshold voltage distribution of the memory cell based on the data before and after the error correction. More detailed operation will be described below.

The NAND interface circuit 27 may be connected to the semiconductor storage device 10 through the NAND bus, for communication with the semiconductor storage device 10. In response to the command of the processor 22, the NAND interface circuit 27 may transmit the command CMD (see FIG. 2), the address ADD (see FIG. 2), and the write data to the semiconductor storage device 10. In addition, the NAND interface circuit 27 may receive read data from the semiconductor storage device 10.

<1-2-3> Configuration of Memory Chip

Figure 2:
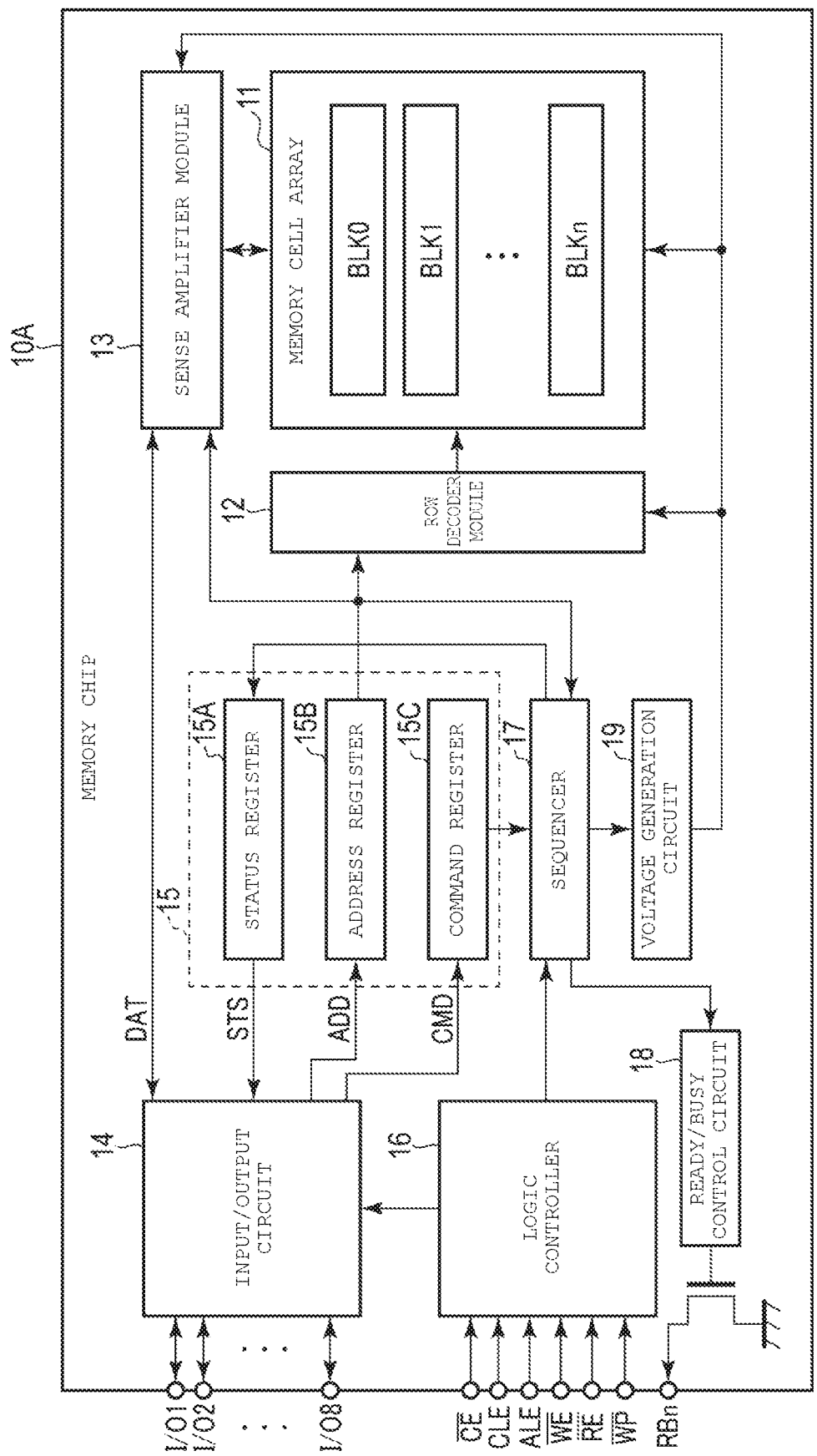
FIG. 2 is a diagram showing a memory chip according to some embodiments.

Next, an example configuration of the memory chip according to some embodiments will be described with reference to FIG. 2. FIG. 2 is a block diagram showing an example configuration of a memory chip according to some embodiments. As shown in FIG. 2, a memory chip 10A includes a memory cell array 11, a row decoder module 12, a sense amplifier module 13, an input/output circuit 14, a register 15, a logic controller 16, a sequencer 17, a ready/busy control circuit 18, and a voltage generation circuit 19.

The memory cell array 11 includes blocks BLK0 to BLKn (n is a natural number of 1 or more). Details of the memory cell array 11 will be described below.

The row decoder module 12 may select a block BLK to be subjected to various operations based on the block address held in the address register 15B. Then, the row decoder module 12 may transfer the voltage supplied from the voltage generation circuit 19 to the selected block BLK. Details of the row decoder module 12 will be described below.

The sense amplifier module 13 may output the data DAT read from the memory cell array 11 to an external controller through the input/output circuit 14. In addition, the sense amplifier module 13 may transmit the write data DAT received from the external controller to the memory cell array 11 through the input/output circuit 14.

For example, the input/output circuit 14 may transmit and receive 8-bit input/output signal I/O (I/O 1 to I/O 8) to and from the external controller. For example, the input/output circuit 14 may transmit the write data DAT included in the input/output signal I/O received from the external controller to the sense amplifier module 13, and may output the read data DAT transmitted from the sense amplifier module 13 to the external controller as an input/output signal I/O.

The register 15 includes a status register 15A, an address register 15B, and a command register 15C. For example, the status register 15A may hold the status information STS of the sequencer 17, and transmit the status information STS to the input/output circuit 14 based on the command of the sequencer 17. The address register 15B may hold the address information ADD transmitted from the input/output circuit 14. The block address, the column address, and the page address included in the address information ADD may be used in the row decoder module 12, the sense amplifier module 13, and the voltage generation circuit 19, respectively. The command register 15C may hold the command CMD transmitted from the input/output circuit 14.

The logic controller may control the input/output circuit 14 and the sequencer 17 based on various control signals received from an external controller. For example, a chip enable signal /CE, a command latch enable signal CLE, an address latch enable signal ALE, a write enable signal /WE, a read enable signal /RE, and a write protect signal /WP are used as various control signals. The signal /CE is a signal for enabling the memory chip 10A. The signal CLE is a signal for notifying the input/output circuit 14 that the signal input to the memory chip 10A in parallel with the asserted signal CLE is the command CMD. The signal ALE s a signal for notifying the input/output circuit 14 that the signal input to the memory chip 10A in parallel with the asserted signal ALE is the address information ADD. For example, signals /WE and /RE are signals for instructing the input/output circuit 14 to input and output an input/output signal I/O. For example, the signal /WP is a signal for setting the memory chip 10A in a protected level, for example, when the power supply is turned on and off.

The sequencer 17 may control the overall operation of the memory chip 10A based on the command CMD held in the command register 15C. For example, the sequencer 17 may control the row decoder module 12, the sense amplifier module 13, the voltage generation circuit 19 and the like to execute various operations such as a write operation and a read operation.

The ready/busy control circuit 18 may generate a ready/busy signal RBn based on the operation level of the sequencer 17. The signal RBn is a signal for notifying the controller 20 whether the memory chip 10A is in a ready level to accept a command from the controller 20 or in a busy level in which a command is not accepted.

The voltage generation circuit 19 can generate a desired voltage based on the control of the sequencer 17 and supply the generated voltage to the memory cell array 11, the row decoder module 12, the sense amplifier module 13, and the like. For example, the voltage generation circuit 19 may apply desired voltages to a signal line corresponding to the selected word line and a signal line corresponding to the unselected word line, respectively, based on the page address held in the address register 15B.

<1-1-4> Configuration of Memory Cell Array

Figure 3:
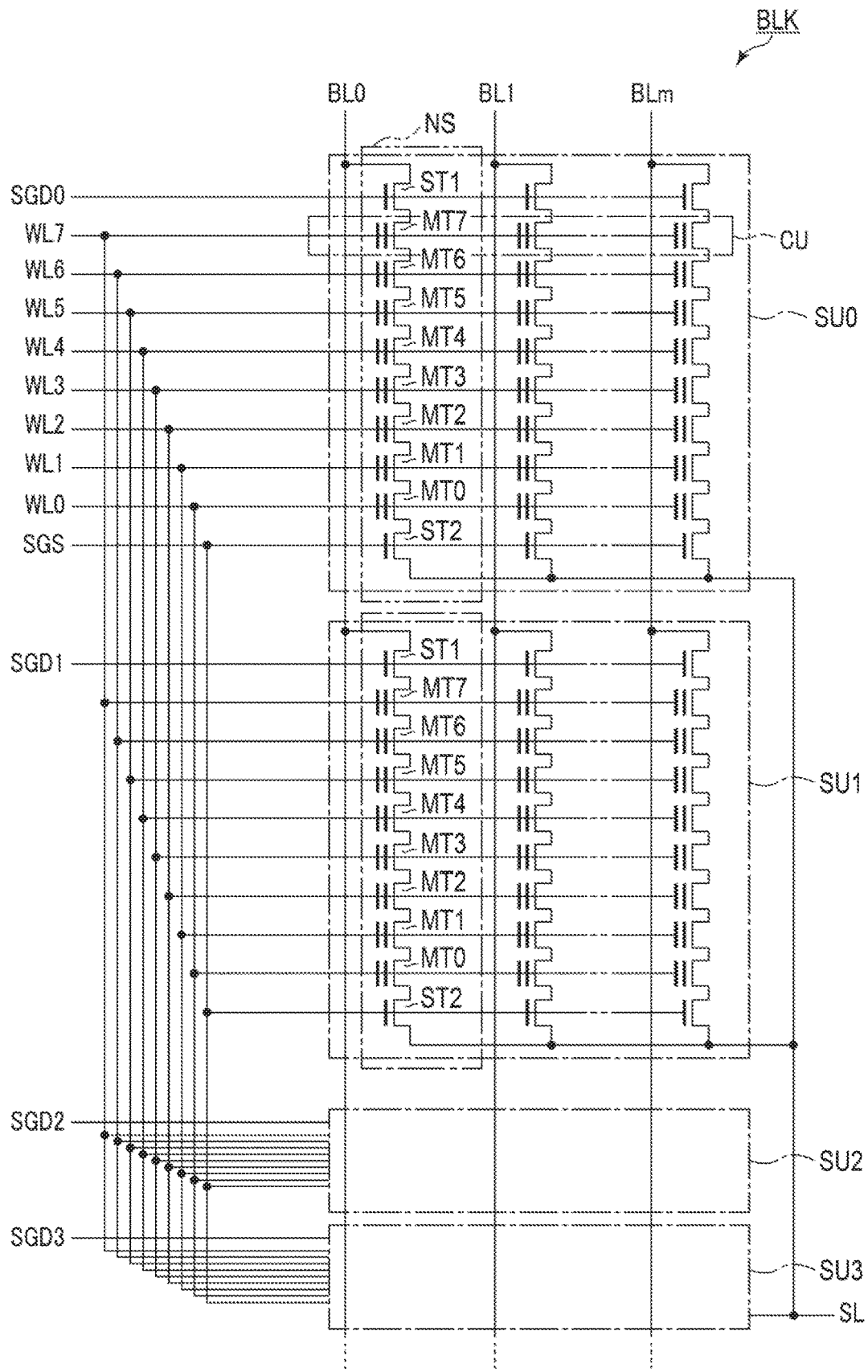
FIG. 3 is a diagram showing a memory cell array according to some embodiments.

Next, a configuration of a memory cell array of a semiconductor storage device according to some embodiments will be described with reference to FIG. 3. FIG. 3 is an example of a circuit diagram for describing a configuration of one block of a memory cell array of a semiconductor storage device according to some embodiments.

For example, as shown in FIG. 3, a block BLK includes four string units SU0 to SU3. Each of the string units SU0 to SU3 includes a plurality of NAND strings NS.

The plurality of NAND strings NS are associated with bit lines BL0 to BLm (m is an integer of 1 or more), respectively. For example, each NAND string NS includes memory cell transistors MT0 to MT7 and select transistors ST1 and ST2.

The memory cell transistor MT may include a control gate and a charge storage layer, and store data in a non-volatile manner. Each of the select transistors ST1 and ST2 may be used for selecting the string unit SU during various operations.

In each NAND string NS, a drain of the select transistor ST1 is connected to an associated bit line BL. Memory cell transistors MT0 to MT7 are connected in series between a source of the select transistor ST1 and a drain of the select transistor ST2.

In the same block BLK, gates of the select transistor ST1 in the string unit SU0 are connected in common to select gate line SGD0. Similarly, in the same block BLK, gates of the select transistors ST1 in the string unit SU1 are connected in common to select gate line SGD1, gates of the select transistors ST1 in the string unit SU2 are connected in common to select gate line SGD2, and gates of the select transistor ST1 in the string unit SU3 are connected in common to select gate line SGD3. The control gates of the memory cell transistors MT0 to MT7 are connected in common to the word lines WL0 to WL 7, respectively. The gate of the select transistor ST2 is connected in common to the select gate line SGS.

Different column addresses are allocated to the bit lines BL0 to BLm, respectively. Each of the bit lines BL0 to BLm is connected in common to a select transistor ST1 of a corresponding NAND string NS among a plurality of blocks BLK. Each of the word lines WL0 to WL 7 is provided for each block BLK. The source line SL is shared between a plurality of blocks BLK, for example.

A group of a plurality of memory cell transistors MT connected to a common word line WL in one string unit SU is referred to as a cell unit CU, for example. For example, the storage capacity of the cell unit CU including the memory cell transistor MT each storing 1 bit data is defined as "one page data". The cell unit CU may have a storage capacity of two page data or more according to the number of bits of the data stored in the memory cell transistor MT.

It is to be noted that the configuration of the semiconductor storage device 10 described above is merely an example, and the embodiments of the present disclosure are not limited thereto. For example, the number of memory cell transistors MT and the number of select transistors ST1 and ST2 in each of the NAND strings NS may be designed to any number, respectively. The number of string units SU in each of the blocks BLK may be designed to any number. The arrangement of transistors to be set as dummy transistors may be designed to any arrangement, and the number of transistors to be set as dummy transistors may be designed to any number.

<1-1-5> Voltages of a Plurality of Memory Cell Transistors MT

The threshold voltage distribution formed by the threshold voltages of the plurality of memory cell transistors MT in the memory cell array will be described with reference to FIG. 4 and FIG. 5.

Figure 4:
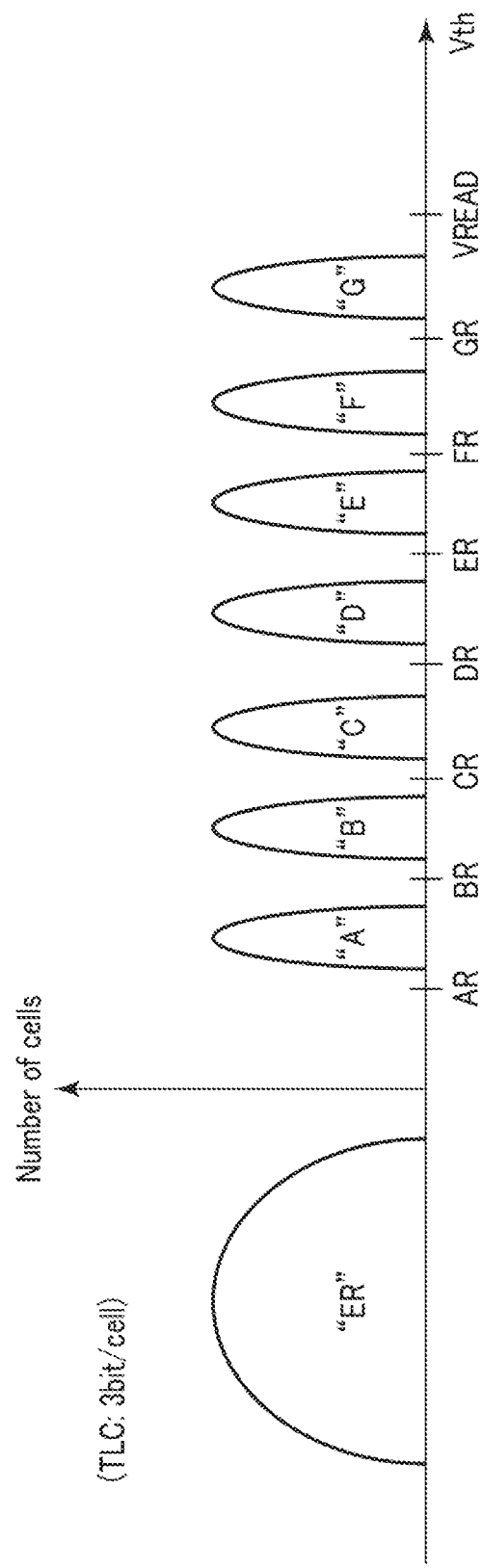
FIG. 4 is a diagram showing threshold voltages of the memory cell transistors according to some embodiments.

FIG. 4 shows a threshold voltage distribution and a read voltage of the memory cell transistor MT when one memory cell transistor MT stores 3-bit data, in which a vertical axis corresponds to the number of memory cell transistors MT, and a horizontal axis corresponds to a threshold voltage Vth of the memory cell transistor MT. As shown in FIG. 4, the plurality of memory cell transistors MT may form a plurality of threshold voltage distributions based on the number of bits of data to be stored. Hereinafter, a triple-level cell (TLC) method in which 3-bit data is stored in one memory cell transistor MT will be described.

With the TLC method, the plurality of memory cell transistors MT form eight threshold voltage distributions. The eight threshold voltage distributions are referred to as "ER" level, "A" level, "B" level, "C" level, "D" level, "E" level, "F" level, "G" level in ascending order of threshold voltage. In addition, the 3-bit data is referred to as lower bit data, middle bit data, and upper bit data.

3-bit data differing from each other is allocated to the threshold voltage distribution of the eight kinds of memory cell transistors MT described above. The allocation of data to the threshold voltage distribution will be described with reference to FIG. 5. For example, as shown in FIG. 5, in the TLC system, "111" data, "0i1" data, "001" data, "000" data, "010" data, "110" data, "100" data, and "101" data (Lower/Middle/Upper) is allocated to "ER" level, "A" level, "B" level, "C" level, "D" level, "E" level, "F" level, and "G" level, respectively.

In the threshold voltage distribution described above, read voltages may be set between adjacent threshold voltage distributions, respectively. For example, the read voltage AR is set between the maximum threshold voltage at the "ER" level and the minimum threshold voltage at the "A" level, and is used for determining whether the threshold voltage of the memory cell transistor MT falls within the threshold voltage distribution of "ER" level or within the threshold voltage distribution of "A" level or higher. When the read voltage AR is applied to the memory cell transistor MT, the memory cell transistor corresponding to the "ER" level is turned on, and the memory cell transistors corresponding to the "A" level, "B" level, "C" level, "D" level, "E" level, "F"

level, and "G" level are turned off. Other read voltages are similarly set. The read voltage BR is set between the threshold voltage distribution of "A" level and the threshold voltage distribution of "B" level, and the read voltage CR is set between the threshold voltage distribution of "B" level and the threshold voltage distribution of "C" level. The read voltage DR is set between the threshold voltage distribution of "C" level and the threshold voltage distribution of "D" level, and the read voltage ER is set between the threshold voltage distribution of "D" level and the threshold voltage distribution of "E" level. The read voltage FR is set between the threshold voltage distribution of "E" level and the threshold voltage distribution of "F" level, and the read voltage GR is set between the threshold voltage distribution of "F" level and the threshold voltage distribution of "G" level. In each writing method, a read pass voltage VREAD is set to a voltage higher than the maximum threshold voltage in the highest threshold voltage distribution. That is, the memory cell transistor MT is turned on regardless of data to be stored, if the read pass voltage VREAD is applied to the gate of the memory cell transistor MT.

The number of bits of data stored in one memory cell transistor MT described above and the allocation of data to the threshold voltage distribution of the memory cell transistor MT are merely an example, and the embodiments of the present disclosure are not limited thereto. For example, data of 4 bits or more may be stored in one memory cell transistor MT, or other various data allocations may be applied to the threshold voltage distribution. In addition, in each of the methods, each read voltage and read pass voltage may be set to the same voltage value or may be set to different voltage values. The memory cell transistor MT is also simply referred to as a memory cell.

Configuration other than the configuration of the memory cell array 11 described above may be applied. The other configurations of the memory cell array 11 are described in U.S. patent application Ser. No. 12/407,403 filed on Mar. 19, 2009 entitled, "Three-dimensional stacked non-volatile semiconductor memory", U.S. patent application Ser. No. 12/406,524 filed on Mar. 18, 2009 entitled, "Three-dimensional stacked non-volatile semiconductor memory", U.S. patent application Ser. No. 12/679,991 filed on Mar. 25, 2010 entitled, "Nonvolatile semiconductor storage device and manufacturing method thereof", and U.S. patent application Ser. No. 12/532,030 filed on Mar. 23, 2009 entitled, "Semiconductor Memory and Manufacturing Method Thereof", for example. These patent applications are incorporated herein by reference in their entirety.

<1-1-6> Variation of Threshold Voltage Distribution

Figure 6:
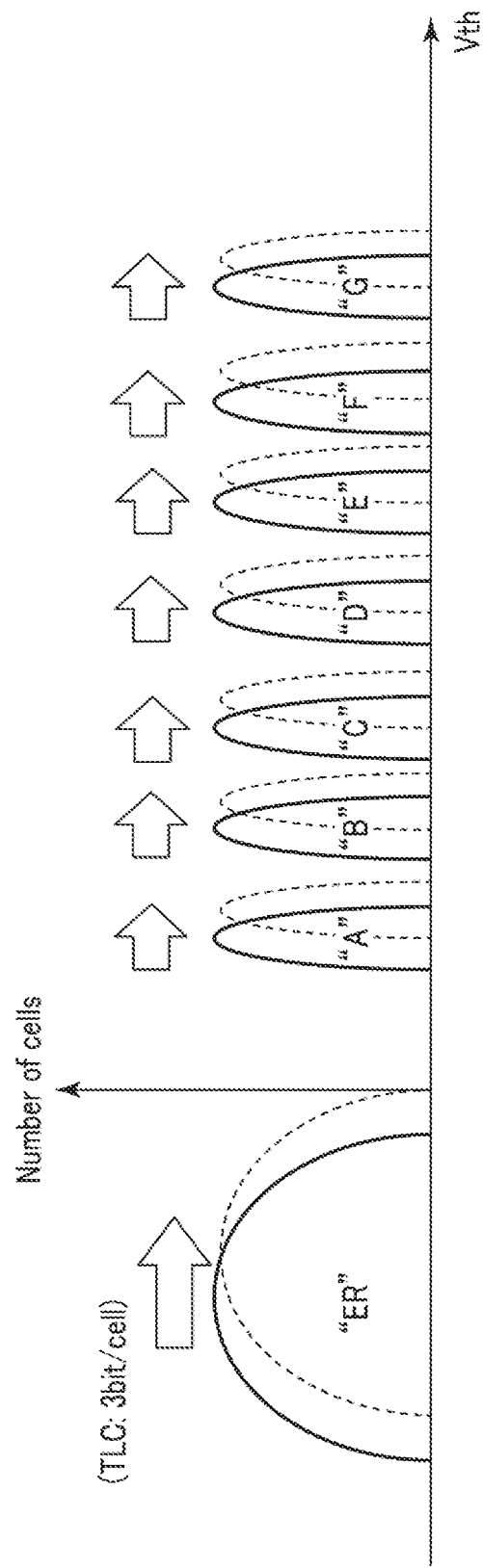
FIG. 6 is a diagram showing an example of variation in the threshold voltage of the memory cell transistor according to some embodiments.
Figure 7:
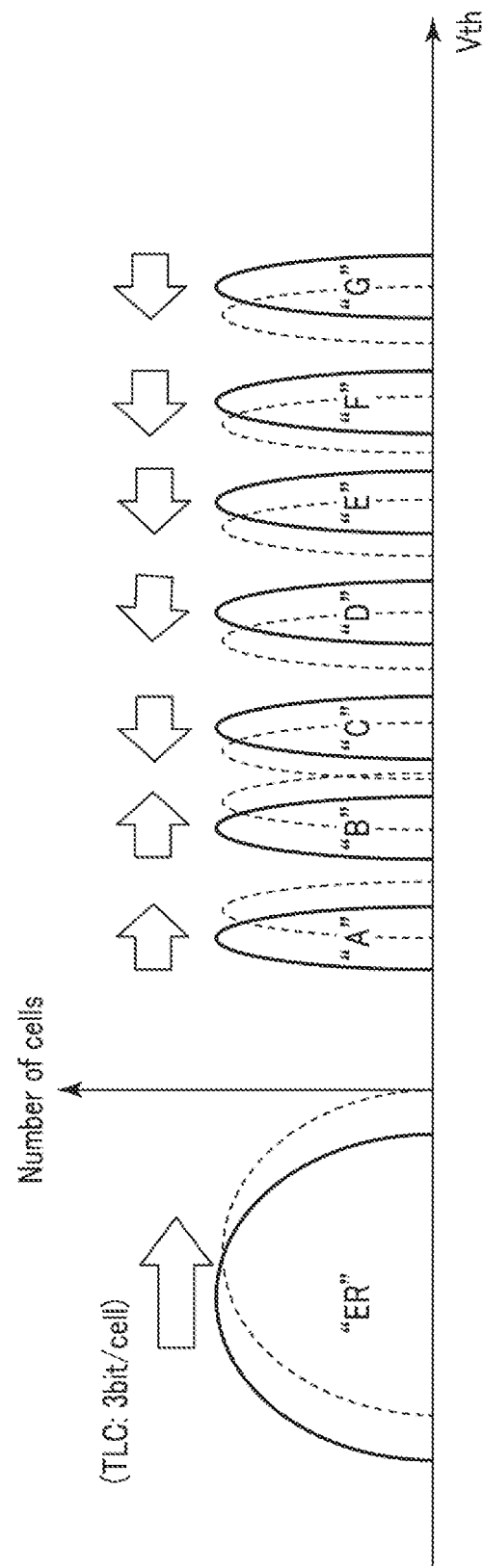
FIG. 7 is a diagram showing an example variation of the threshold voltage of the memory cell transistor according to some embodiments.

Next, the variation of the threshold voltage distribution will be described with reference to FIG. 6 and FIG. 7. In FIG. 6 and FIG. 7, the threshold voltage distribution before variation is shown in solid line, and the threshold voltage distribution after variation is shown in broken line.

In the memory cell transistor MT, the threshold voltage distribution may vary due to various factors. The variation may be caused by the type of stress applied to the memory cell transistor MT.

For example, when the memory cell transistor MT receives a read disturb stress, as shown in FIG. 6, the threshold voltage distribution as a whole shifts to the right direction (direction in which Vth is high).

In addition, when the memory cell transistor MT receives a data retention stress, as shown in FIG. 7, the threshold voltage distribution as a whole shifts so as to concentrate on the "A" level and the "B" level.

<1-1-7> Estimator

Next, the estimator 26 will be described with reference to FIG. 8. While FIG. 8 divides the estimator 26 into constituent elements for each function, it is not necessarily required that hardware be divided like this.

Figure 8:
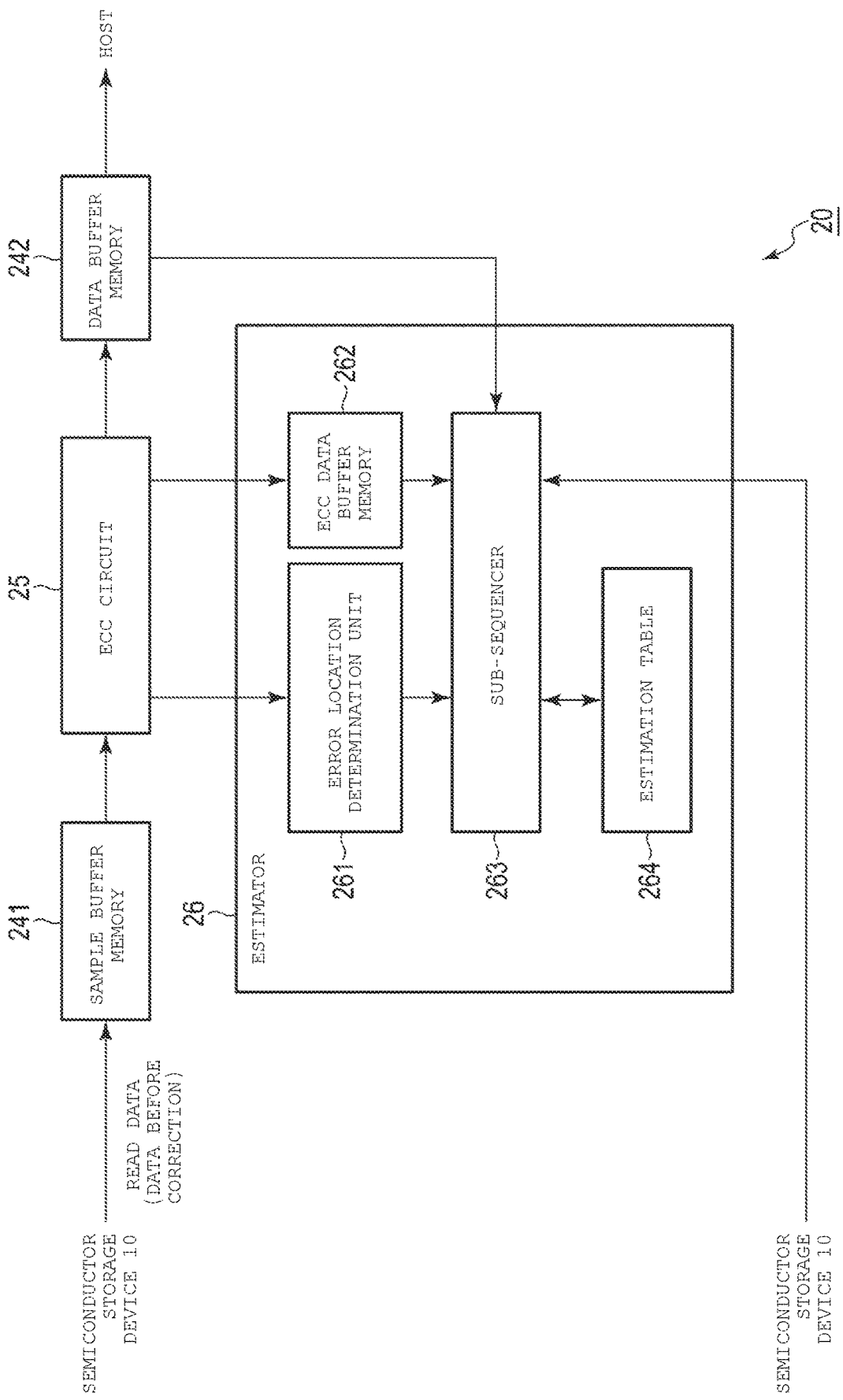
FIG. 8 is a diagram showing an estimator according to some embodiments.

As shown in FIG. 8, data read from the semiconductor storage device 10 may be stored in a sample buffer memory 241 as data before correction.

Then, the ECC circuit 25 may determine whether or not the data read from the sample buffer memory 241 contains an error. The ECC circuit 25 may supply the data read from the sample buffer memory 241 to the data buffer memory 242 when it is determined that there is no error in the data. When determining that there is an error in the data, the ECC circuit 25 may perform error correction process. When the error correction process of the data is successfully performed, the ECC circuit 25 may supply the error information to the estimator 26. This error information may include the data before error correction process, the data after error correction process, and error location information. When the data error correction process is successfully performed, the ECC circuit 25 may supply the data after error correction to the data buffer memory 242.

The estimation unit 26 includes an error location determination unit 261, an ECC data buffer memory 262, a sub-sequencer 263, and an estimation table 264.

The error location determination unit 261 may receive and store the error location information from the ECC circuit 25. Then, the location of the error (error location such as a specific page, block, or the like) may be determined based on the error location information.

The ECC data buffer memory 262 may receive the data before the error correction process and the data after the error correction process from the ECC circuit 25 and store the received data.

The sub-sequencer 263 may control the estimator 26. Specifically, the sub-sequencer 263 may read information for specifying the level of error data, from the data buffer memory 242 or the semiconductor storage device 10, based on the error location of the error determined by the error location determination unit 261. For example, when the data after the error correction is the data of the middle page, the data of the upper page and the lower page is read. Then, the sub-sequencer 263 may generate a variation estimation table (see FIG. 12) based on the information necessary for specifying the level of the error data. When the variation estimation table is completed, the sub-sequencer 263 may determine the type of variation and the strength of the block based on the variation estimation table. The estimation table 264 may store the variation estimation table.

<1-2> Operation

A method of determining the type of variation according to some embodiments will be described with reference to FIG. 9. The type of variation may be determined during patrol, for example. For example, this patrol is an operation performed by the controller 20 while the memory system 1 is not accessed from the host device 2. The patrol may be an operation for checking and confirming whether data recorded in the semiconductor storage device 10 is not lost due to deterioration of the medium.

The patrol may be a process of reading out data stored in the semiconductor storage device 10 by a predetermined unit and checking the read data based on the error correction result obtained by process of the ECC circuit 25, in order to detect a block with an increased error, for example.

This checking may involve, for example, comparing the number of error bits of the read data with a threshold voltage, and determining data whose number of error bits exceeds a threshold voltage to be a target of refresh. For example, when the number of error bits of the read data from a certain page exceeds the threshold voltage, the processor 22 (see FIG. 1) may determine the data in the block including the certain page as a target of refresh. That is, the processor may re-store or relocate the data stored in the block that includes the page whose number of error bits exceeds the threshold voltage into another block. The processor may invalidate the data stored in the original block. In the method of determining the type of variation shown in FIG. 9, the patrol processing for a certain block is shown. However, the unit as a basis of performing the patrol is not limited to the block unit, and may be a unit larger than the size of the block unit (e.g., the size of block BLK as shown in FIG. 3) or a unit smaller than the size of the block unit.

Figure 9:
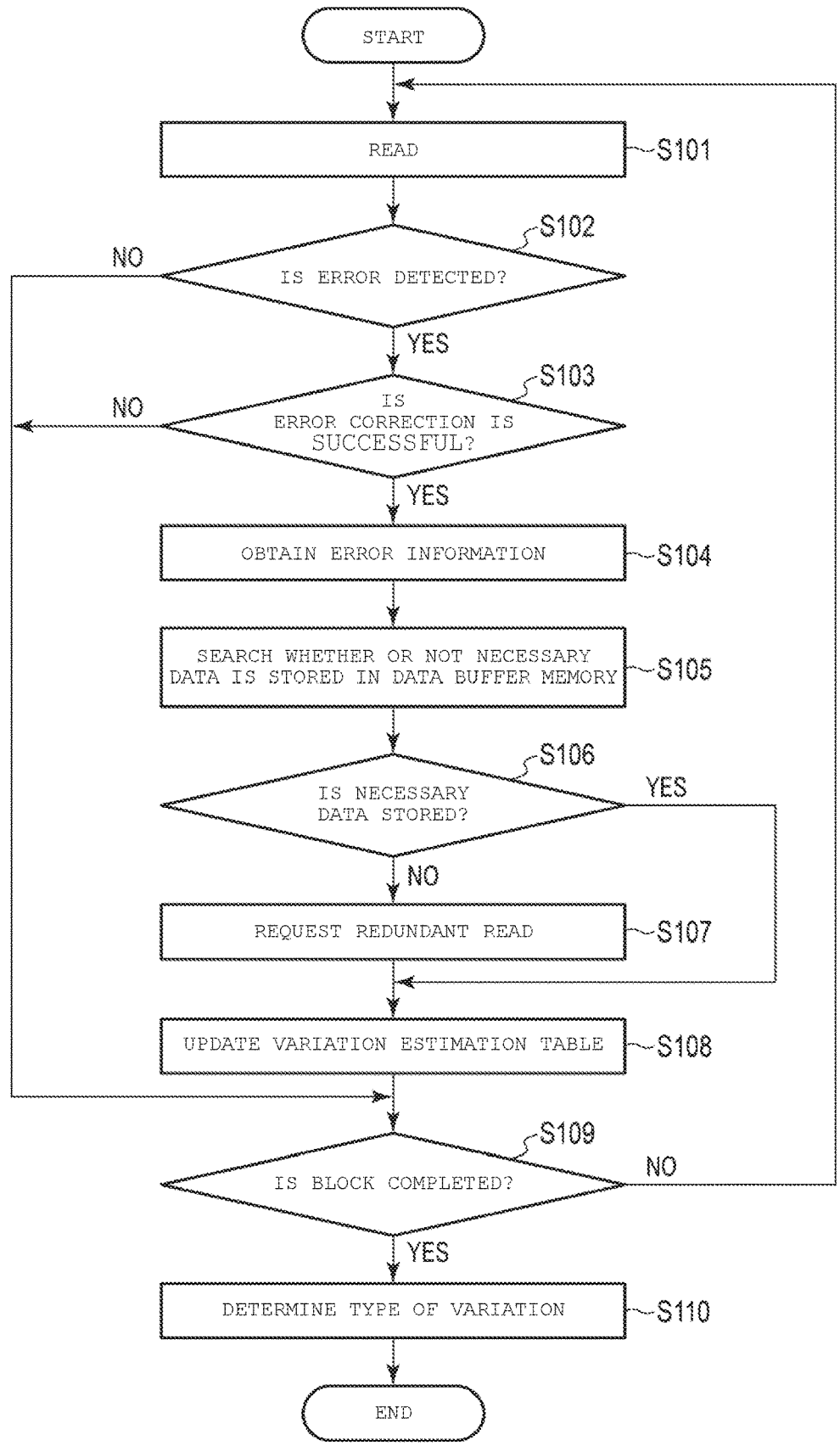
FIG. 9 is a flowchart illustrating how a type of stress in a certain block is determined according to some embodiments.

Referring to FIG. 9, in step S101, the controller 20 may read data from the semiconductor storage device 10. Then, the controller 20 may supply the data to the FCC circuit 25 in a unit of data that may be error-corrected (also described as a frame, or the like).

In step S102, the FCC circuit 25 may determine the presence or absence of an error in the data based on the frame (also referred to as read data) read out from the semiconductor storage device 10. When determining that there is no error in the read data (step S102, NO), the FCC circuit 25 may supply the read data to the data buffer memory 242.

When determining that there is an error in the read data (step S102, YES), the FCC circuit 25 performs error correction process. Then, in step S103, the ECC circuit 25 may determine whether or not the error correction process is successful. When determining that the error correction process is not successful (step S103, NO), the FCC circuit 25 may notify the processor 22, and the like, that the error correction process is not successful.

When determining that the error correction process is successful (step S103, YES), the FCC circuit 25 obtains error information in step S104.

Here, the reason for acquiring the error information will be described. FIG. 10 shows the relationship between data before error correction and data after error correction. For example, when the error correction process of the data indicated in a dashed line circle in FIG. 10 is successful, it is not possible to determine from which level and to which level the data is varied based on this data alone. Error information may be acquired in order to investigate the variation. Specifically, the ECC circuit 25 may cause the error location determination unit 261 to store error location information (e.g., page, block, and the like) which is one type of error information. In addition, the ECC circuit 25 may cause the ECC data buffer memory 262 to store the data before the error correction process and the data after the error correction process. In addition, the ECC circuit 25 may cause the data buffer memory 242 to store the data after the error correction process.

S105

The sub-sequencer 263 may acquire the error information from the error location determination unit 261 and the ECC data buffer memory 262, thereby specifying or obtaining the information necessary for specifying the level of the data (error data) that has an error and that is error-corrected. Then, in step S105, the sub-sequencer 263 may search whether or not information necessary for specifying the level of the error data is stored in the data buffer memory 242.

In step S106, the sub-sequencer 263 may determine whether or not information necessary for specifying the level of the error data is stored in the data buffer memory 242. When determining that the information necessary for specifying the level of the error data is stored in the data buffer memory 242 (step S106, YES), the sub-sequencer 263 may read the necessary information from the data buffer memory 242.

When determining that the information necessary for specifying the level of the error data is not stored in the data buffer memory 242 (step S106, NO), the sub-sequencer 263 may request a redundant read to read necessary information from the semiconductor storage device 10.

The sub-sequencer 263 (see FIG. 8) can know the level before the error correction and the level after the error correction, as long as the information necessary for specifying the level of the error data is obtained.

FIG. 11 shows a specific example of the level before error correction and the level after error correction. For example, in steps S101 to S107, as shown in FIG. 11, data "010" may be varied to data "000". As shown in FIG. 5, the data "010" is the "D" level and the data "000" is the "C" level. This indicates that the level is varied from "D" level to "C" level. In this case, as shown in FIG. 12, the variation estimation table stored in the estimation table 264 may be updated.

The variation estimation table may be a table that records (1) the relationship between the level after the success of the ECC and the number of the memory cell transistors (number of variations) varied in the leftward direction (the direction of low level) or (2) the relationship between the level after the success of the FCC and the number of memory cell transistors varied in the rightward direction (the direction of high level). This variation estimation table may be generated and stored for each block, for example. For example, when a certain memory cell transistor is varied in the rightward direction, a value corresponding to the "right" row and the level after error correction is counted up. In addition, when a certain memory cell transistor is varied in the leftward direction, a value corresponding to the "left" row and the level after error correction is counted up. Specifically, the value corresponding to "right" row and the "Er" level is "13", which means that there are "13" memory cell transistors of "Er" level that are varied to the right side. In addition, the value corresponding to the "left" and the "G" level is "5", which means that there are "5" memory cell transistors of "G" level that is varied to the left side.

In the example shown in FIG. 11, it may be seen that the level of the memory cell transistor is varied from "D" level to "C" level, that is, the level is varied to the left side. Therefore, in step S108, as shown in a dashed line circle in FIG. 12, the value of the "left" row and "D" level is counted up by only "1".

In step S109, the sub-sequencer 263 may determine whether or not all the data in the block from which data is being read is read. When reading in the block is not completed (step S109, NO), step S101 is repeated.

When determining that the reading in the block is completed (step S109, YES), the sub-sequencer 263 may determine the type of variation in the read block based on the variation estimation table in the estimation table 264 in step S110.

For example, the sub-sequencer 263 may compare the number of memory cell transistors belonging to the "left" row in the variation estimation table with the number of memory cell transistors belonging to the "right" row in the variation estimation table, and may determine that "the memory cell transistor MT is under read disturb stress", when there are greater number of memory cell transistors belonging to the "right" row. In addition, the sub-sequencer 263 may compare the number of memory cell transistors belonging to the "left" row in the variation estimation table with the number of memory cell transistors belonging to the "right" row in the variation estimation table, and may determine that "the memory cell transistor MT is under data retention stress", when there are greater number of memory cell transistors belonging to the "left" row.

The determination method described above is merely an example, and the type of stress derived from the number of memory cell transistors in the variation estimation table is not limited thereto, and may be variously changed.

<1-3> Effect

According to the embodiments described above, by referring to a table that tabulates the direction in which the level of the memory cell transistor is varied, the type of variation in a certain block can be specified, and as a result, the type of stress can be determined. As a result, the controller 20 can specify the type of stress for each block and allows appropriate operation for each block.

In addition, the sub-sequencer 263 can determine the strength against the stress of the block, according to the degree of variation. As a result, the sub-sequencer 263 can estimate the strength of the device (a strength of the stress suffered by the device).

The controller 20 may use the determined type of stress of the block and the strength of the block when adjusting the read voltage in the next reading or determining the data refreshing method, or the like.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory system comprising:
    a memory device including a plurality of memory cells capable of storing m bits data corresponding to threshold voltages of an m-th power of two, m being a natural number of two or more;
    a controller configured to
        read data from the memory cells,
        perform an error correction when there is an error in the read data,
        determine a variation between the threshold voltage of the read data before the error correction is performed and the threshold voltage of the read data after the error correction is performed, and
        determine a type of stress of the memory device based on the number of memory cells having variation of the threshold voltage and a direction of the variation of threshold voltage, the direction of the variation including information as to whether the threshold voltage of the read data before the error correction is performed is lower or higher than the threshold voltage of the read data after the error correction is performed.

2. The memory system according to claim 1, wherein the controller is further configured to determine a strength of a stress of the memory device based on the number of memory cells having variation of the threshold voltage and the direction of the variation of threshold voltage.

3. The memory system according to claim 2, wherein the controller is configured to adjust a read voltage based on the determined type of stress of the memory device and the determined strength of stress of the memory device.

4. The memory system according to claim 1, wherein the controller is further configured to store the number of memory cells having variation of the threshold voltage and a direction of the variation of threshold voltage.

5. The memory system according to claim 1, wherein the controller is configured to determine the variation between the threshold voltage of the read data before the error correction is performed and the threshold voltage of the read data after the error correction is performed, while there is no access from an external device.

6. The memory system according to claim 1, wherein
    the memory device is configured to read data in a unit of a page from the memory cells,
    the plurality of memory cells corresponds to m pages, and
    the controller is configured to perform the error correction on the one page of the m pages when there is an error in the one page and determine the variation between the threshold voltage of the read data before the error correction is performed and the threshold voltage of the read data after the error correction is performed by using data of the one page where the error correction is performed and data of the (m−1) pages.

7. A method of determining level variations in a memory device that includes a plurality of memory cells, the method comprising:
    storing m bits data corresponding to threshold voltages of an m-th power of two, m being a natural number of two or more;
    reading data from the memory cells;
    performing an error correction when there is an error in the read data;
    determining the variation between the threshold voltage of the read data before performing the error correction and the threshold voltage of the read data after performing the error correction;
    determining a type of stress of the memory device based on the number of memory cells having variation of the threshold voltage and a direction of the variation of threshold voltage, the direction of the variation including information as to whether the threshold voltage of the read data before performing the error correction is lower or higher than the threshold voltage of the read data after performing the error correction; and
    determining the variation between the threshold voltage of the read data before performing the error correction and the threshold voltage of the read data after performing the error correction to specify the number of memory cells having variation of the threshold voltage and a direction of the variation of threshold voltage.

8. The method according to claim 7, further comprising:
storing the number of memory cells having variation of the threshold voltage and a direction of the variation of threshold voltage.

9. The method according to claim 7, further comprising:
determining a strength of a stress of the memory device based on the number of memory cells having variation of the threshold voltage and the direction of the variation of threshold voltage.

10. The method according to claim 9, further comprising adjusting a read voltage based on the determined type of stress of the memory device and the determined strength of stress of the memory device.

11. The method according to claim 7, wherein the determining the variation between the threshold voltage of the read data before performing the error correction and the threshold voltage of the read data after performing the error correction occurs while there is no access from an external device.

12. The method according to claim 7, wherein
the memory device is configured to read data in a unit of a page from the memory cells,
the plurality of memory cells corresponds to m pages, and
the performing an error correction includes performing the error correction on the one page of the m pages when there is an error in the one page, and
the determining the variation between the threshold voltage of the read data before performing the error correction and the threshold voltage of the read data after performing the error correction uses data of the one page where the error correction is performed and data of the (m−1) pages.

* * * * *